US009437667B2

(12) United States Patent
Kwon et al.

(10) Patent No.: US 9,437,667 B2
(45) Date of Patent: Sep. 6, 2016

(54) DISPLAY DEVICE

(71) Applicant: Samsung Display Co., Ltd., Yongin, Gyeonggi-Do (KR)

(72) Inventors: Dohyun Kwon, Yongin (KR); Taehyun Kim, Yongin (KR); Donghwan Shim, Yongin (KR); Suyeon Sim, Yongin (KR); Minjung Lee, Yongin (KR); Sungeun Lee, Yongin (KR); Jungkyu Lee, Yongin (KR); Seunghwan Cho, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/693,737

(22) Filed: Apr. 22, 2015

(65) Prior Publication Data
US 2016/0126303 A1 May 5, 2016

(30) Foreign Application Priority Data

Oct. 31, 2014 (KR) .................. 10-2014-0150633

(51) Int. Cl.
*H01L 27/32* (2006.01)
*H01L 27/12* (2006.01)
*G09G 3/32* (2016.01)

(52) U.S. Cl.
CPC ....... *H01L 27/3276* (2013.01); *H01L 27/3248* (2013.01); *H01L 27/3265* (2013.01); *G09G 3/3233* (2013.01); *G09G 2300/0842* (2013.01); *G09G 2310/0262* (2013.01); *H01L 27/1255* (2013.01); *H01L 27/1259* (2013.01)

(58) Field of Classification Search
CPC combination set(s) only.
See application file for complete search history.

(56) References Cited

U.S. PATENT DOCUMENTS

| 2011/0096258 A1* | 4/2011 | Shim ..................... G02F 1/1333 349/39 |
| 2013/0293595 A1* | 11/2013 | Kim ..................... G09G 3/3611 345/690 |
| 2014/0034923 A1 | 2/2014 | Kim et al. |

FOREIGN PATENT DOCUMENTS

| KR | 10-2002-0012795 A | 2/2002 |
| KR | 10-2005-0122894 A | 12/2005 |
| KR | 10-2006-0065847 A | 6/2006 |
| KR | 10-2014-0018623 A | 2/2014 |

* cited by examiner

*Primary Examiner* — Mohammad Islam
*Assistant Examiner* — Ratisha Mehta
(74) *Attorney, Agent, or Firm* — Knobbe Martens Olson & Bear LLP

(57) ABSTRACT

A display device is disclosed. In one aspect, the device includes a substrate including a display area displaying an image via a plurality of pixels and a non-display area adjacent to the display area. The device also includes a first line and a second line in the display area. The display device also includes a first connection line and a second connection line in the non-display area, wherein the first and second connection lines are respectively connected to the first and second lines and extend in different directions to cross each other. The display device also includes an insulating layer formed over the substrate and including a first portion and a second portion, the first portion corresponding to the display area and the second portion corresponds to a crossing area where the first and second connection lines cross each other, the thickness of the first and second portions are different.

20 Claims, 5 Drawing Sheets

DISPLAY DEVICE

RELATED APPLICATION

This application claims the benefit of Korean Patent Application No. 10-2014-0150633, filed on Oct. 31, 2014, in the Korean Intellectual Property Office, the disclosure of which is incorporated herein in its entirety by reference.

BACKGROUND

1. Field

The described technology generally relates to a display device.

2. Description of the Related Technology

Display devices are becoming slimmer and more lightweight, and thus, more widely used. Many portable displace devices use thin flat panel displays.

A display device includes on its face a display area on which an image is generated, the rest of the device being a non-display area. Generally, signal and power lines are formed in the display area along with pixels so as to realize images. Lines that are connected to the display area are formed in the non-display area z where supporting circuitry resides.

SUMMARY OF CERTAIN INVENTIVE ASPECTS

One inventive aspect is a display device.

Another aspect is a display device that includes a substrate including a display area displaying an image via a plurality of pixels, and a non-display area formed in a vicinity of the display area; a first line and a second line formed in the display area and transferring an electrical signal to each of the plurality of pixels; a first connection line and a second connection line formed in the non-display area, a first connection line and a second connection line are connected to the first line and the second line, respectively, and extend in different directions so as to cross each other; and an insulating layer formed on the substrate and including a first portion and a second portion, wherein the first portion corresponds to the display area and the second portion corresponds to a cross area in which the first connection line and the second connection line cross each other, wherein a thickness of the first portion is different from a thickness of the second portion.

The first connection line and the second connection line can be formed on different layers, and the second portion of the insulating layer can be interposed between the first connection line and the second connection line.

The display device can further include a storage capacitor formed in the display area and including a first electrode and a second electrode formed over the first electrode, and the first portion of the insulating layer can be interposed between the first electrode and the second electrode.

The thickness of the second portion can be greater than the thickness of the first portion.

The first connection line can be formed on a same layer as the first electrode and can include a same material as the first electrode, and the second connection line can be formed on a same material layer as the second electrode and can include a same material as the second electrode.

Each of the plurality of pixels can be electrically connected to a data line for transferring a data signal, a driving voltage line for transferring a driving voltage, and an initialization voltage line for transferring an initialization voltage, the first line can be one of the data line, the driving voltage line, and the initialization voltage line, and the second line can be another one of the data line, the driving voltage line, and the initialization voltage line, excluding the one that is the first line.

The first line and the first connection line can be formed on different layers and can be electrically connected to each other via a contact hole.

The first line and the first connection line can be formed on a same layer.

The second line and the second connection line can be formed on different layers and can be electrically connected to each other via a contact hole.

The thickness of the second portion of the insulating layer can be substantially equal to or greater than 2000 Å.

The thickness of the first portion of the insulating layer can be substantially equal to or less than 1200 Å.

Another aspect is a display device comprising a substrate including i) a display area configured to display an image via a plurality of pixels and ii) a non-display area adjacent to the display area. The display device also comprises a first line and a second line formed in the display area, wherein each of the first and second lines is configured to transfer an electrical signal to the pixels. The display device also comprises a first connection line and a second connection line formed in the non-display area, wherein the first and second connection lines are respectively connected to the first and second lines and extend in different directions to cross each other. The display device also comprises an insulating layer formed over the substrate and including a first portion and a second portion, wherein the first portion corresponds to the display area and the second portion corresponds to a crossing area where the first and second connection lines cross each other, and wherein the thickness of the first portion is different from the thickness of the second portion.

In the above display device, the first and second connection lines are formed on different layers, wherein the second portion of the insulating layer is interposed between the first and second connection lines.

The above display device further comprises a storage capacitor formed in the display area and including a first electrode and a second electrode formed over the first electrode, wherein the first portion of the insulating layer is interposed between the first and second electrodes.

In the above display device, the second portion is thicker than the first portion.

In the above display device, the first connection line is formed on the same layer and of the same material as the first electrode, wherein the second connection line is formed on the same layer and of the same material as the second electrode.

In the above display device, each of the pixels is electrically connected to a data line configured to transfer a data signal, a driving voltage line configured to transfer a driving voltage, and an initialization voltage line configured to transfer an initialization voltage, wherein the first line is one of the data line, the driving voltage line, and the initialization voltage line, and wherein the second line is another one of the data line, the driving voltage line, and the initialization voltage line.

In the above display device, the first line and the first connection line are formed on different layers and are electrically connected to each other via a first contact hole.

In the above display device, the first line and the first connection line are formed on the same layer.

In the above display device, the second line and the second connection line are formed on different layers and are electrically connected to each other via a second contact hole.

In the above display device, the thickness of the second portion of the insulating layer is substantially equal to or greater than about 2000 Å.

In the above display device, the thickness of the first portion of the insulating layer is substantially equal to or less than about 1200 Å.

Another aspect is a display device comprising a substrate including i) a display area configured to display an image via a plurality of pixels and ii) a crossing area formed adjacent to the display area. The display device also comprises a first line and a second line formed in the display area and the crossing area, wherein the first and second lines at least partially overlap each other in the crossing area. The display device also comprises an insulating layer formed over the substrate and including a first portion and a second portion, wherein the first portion corresponds to the display area and the second portion corresponds to the crossing area, and wherein the thickness of the first portion is different from the thickness of the second portion.

In the above display device, the first and second lines are formed on different layers in the crossing area, wherein the second portion of the insulating layer is interposed between the first and second lines.

The above display device further comprises a storage capacitor formed in the display area and including a first electrode and a second electrode formed over the first electrode, wherein the first portion of the insulating layer is interposed between the first and second electrodes.

In the above display device, the second portion is thicker than the first portion.

In the above display device, the first line is formed on the same layer and of the same material as the first electrode in the crossing area, wherein the second line is formed on the same layer and of the same material as the second electrode in the crossing area.

In the above display device, each of the pixels is electrically connected to a data line configured to transfer a data signal, a driving voltage line configured to transfer a driving voltage, and an initialization voltage line configured to transfer an initialization voltage, wherein the first line is one of the data line, the driving voltage line, and the initialization voltage line, and wherein the second line is another one of the data line, the driving voltage line, and the initialization voltage line.

In the above display device, a first portion of the first line in the display area and a second portion of the first line in the crossing area are formed on different layers and are electrically connected to each other via a first contact hole, and wherein a first portion of the second line in the display area and a second portion of the second line in the crossing area are formed on different layers and are electrically connected to each other via a second contact hole.

In the above display device, the thickness of the second portion of the insulating layer is substantially equal to or greater than about 2000 Å.

In the above display device, the thickness of the first portion of the insulating layer is substantially equal to or less than about 1200 Å.

DETAILED DESCRIPTION OF CERTAIN INVENTIVE EMBODIMENTS

Figure 1:
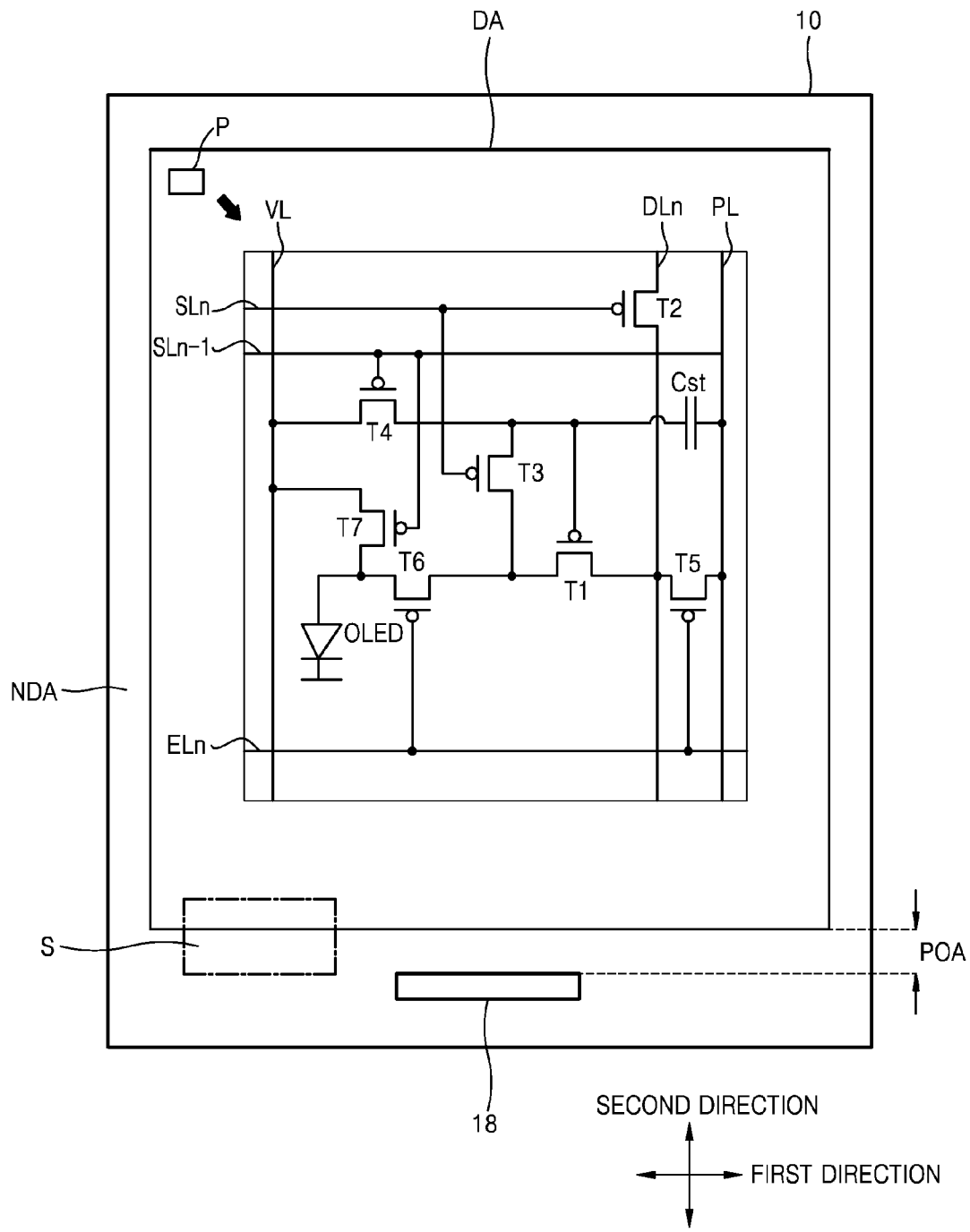
FIG. 1 is a plan view of a display device according to an exemplary embodiment.

As the described technology allows for various changes and numerous embodiments, particular embodiments will be illustrated in the drawings and described in detail in the written description. The effects and features of the described technology will now be described more fully with reference to the accompanying drawings, in which exemplary embodiments are shown. The described technology can, however, be embodied in many different forms and should not be construed as being limited to the embodiments set forth herein.

Those components that are the same or are in correspondence are rendered the same reference numeral regardless of the figure number, and redundant explanations are omitted.

Throughout the specification, while such terms as "first," "second," etc., can be used to describe various components, such components must not be limited to the above terms. The above terms are used only to distinguish one component from another.

Throughout the specification, a singular form can include plural forms, unless there is a particular description contrary thereto.

Throughout the specification, terms such as "comprise" or "comprising" are used to specify existence of features and/or components described in the specification, not excluding the existence of one or more other features and/or one or more other components.

It will be understood that when a layer, an area, a component, or the like is referred to as being "on" another layer, area, or component can be directly on another layer, area, or component or intervening layer, area, or component can also be present.

In the drawings, the thicknesses of layers and regions are exaggerated for clarity. For example, the thicknesses and sizes of elements in the drawings are arbitrarily shown for convenience of description, thus, the spirit and scope of the described technology are not necessarily defined by the drawings.

Also, it should also be noted that in some alternative implementations, the steps of all methods described herein can occur out of the order. For example, two steps illustrated in succession can in fact be executed substantially concurrently or the two steps can sometimes be executed in the reverse order.

As used herein, the term "and/or" includes any and all combinations of one or more of the associated listed items. In this disclosure, the term "substantially" includes the meanings of completely, almost completely, or to any significant degree under some applications and in accordance with those skilled in the art. Moreover, "formed on" can also mean "formed over." The term "connected" can include an electrical connection.

FIG. 1 is a plan view of a display device according to an exemplary embodiment.

Referring to FIG. 1, the display device includes a display area DA and a non-display area NDA on a substrate 10.

The substrate 10 can be formed of a glass material or a plastic material. The plastic material can include various materials such as polyethylen terephthalate (PET), polyethylen naphthalate (PEN), polyimide, or the like. In some embodiments, the substrate 10 has light-transmittance, but the described technology is not limited thereto. In another embodiment, the substrate 10 does not have light-transmittance.

The display area DA can have various pixels P so as to realize an image. Each of the pixels P can include a plurality of thin-film transistors (TFTs) T1 through T7 and a storage capacitor Cst. Each pixel P can include a display device such as an organic light-emitting diode (OLED) that emits light by receiving a driving voltage via the TFTs T1 through T7 and the storage capacitor Cst.

The TFTs T1 through T7 can include a driving TFT T1, and a plurality of switching TFTs including a transfer TFT T2, a compensation TFT T3, a first initialization TFT T4, a first emission control TFT T5, a second emission control TFT T6, and a second initialization TFT T7.

Each pixel P (hereinafter, the pixel P) can include a first scan line SLn, a second scan line SLn-1, and an emission control line ELn that extend along a first direction. The pixel P can include a data line DLn, a driving voltage line PL, and an initialization voltage line VL that extend along a second direction.

The first scan line SLn can transfer a first scan signal to the data transfer TFT T2 and the compensation TFT T3, the second scan line SLn-1 can transfer a second scan signal to the first initialization TFT T4 and the second initialization TFT T7, and the emission control line ELn can transfer an emission control signal to the first emission control TFT T5 and the second emission control TFT T6. The data line DLn can transfer a data signal to the pixel P, the driving voltage line PL can transfer a first power voltage to the pixel P, and the initialization voltage line VL can transfer an initialization voltage for initializing the driving TFT T1.

In the present embodiment, 7 TFTs are shown but the described technology is not limited thereto. Thus, in another embodiment, the number of TFTs is changed.

Also, in the present embodiment, 2 scan lines are formed but the described technology is not limited thereto. Thus, in another embodiment, the number of scan lines is changed.

In the present embodiment, each of the pixels P includes the data line DLn, the driving voltage line PL, and the initialization voltage line VL that are electrically connected to of the pixels P, but the described technology is not limited thereto. In other embodiments, the driving voltage line PL and/or the initialization voltage line VL are shared between neighboring pixels P.

The non-display area NDA is formed to be adjacent to the display area DA. As illustrated in FIG. 1, in the present embodiment, the non-display area NDA is formed to surround the display area DA. In another embodiment, the non-display area NDA is formed to be adjacent to a side of the display area DA.

The non-display area NDA can include a pad part 18, a voltage supply line (not shown) and a connection area POA.

The pad part 18 can have a driver integrated circuit (IC) (not shown) mounted therein. The driver IC is a chip on glass (COG) type driver IC. The driver IC can include a connection terminal (not shown) that is electrically connected to the pad part 18 formed on the substrate 10.

The connection area POA is one of portions of the non-display area NDA which contacts the display area DA. In the connection area POA, fanout lines that connect the pad part 18 to the display area DA and transfer a signal from the driver IC mounted in the pad part 18 are formed.

Furthermore, incoming lines that connect the voltage supply line and the display area DA and supply a voltage can be formed.

Figure 2:
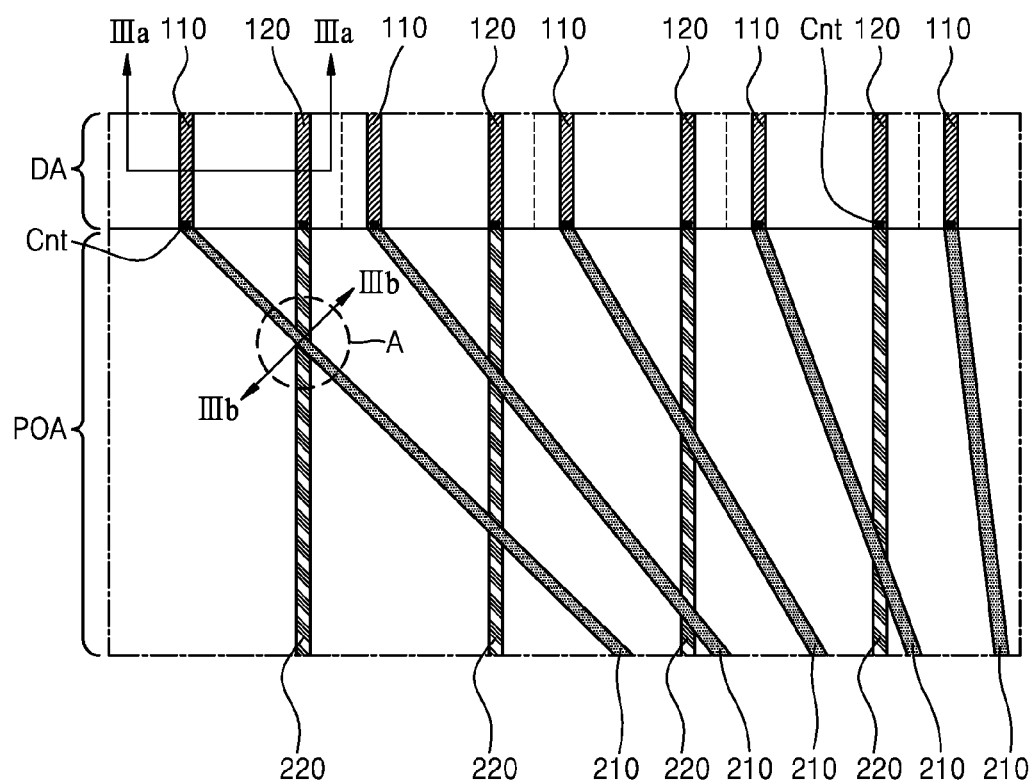
FIG. 2 is a magnified view of a portion S shown in FIG. 1.
Figure 2:
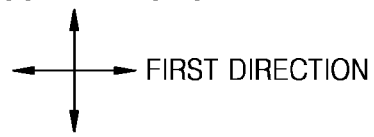

FIG. 2 is a magnified view of a portion S shown in FIG. 1.

The first line 110 and the second line 120 that extend lengthwise along a second direction are formed in the display area DA. A first connection line 210 connected to the first line 110 and a second connection line 220 connected to the second line 120 can be formed in the connection area POA.

The first line 110 can be formed on the same layer as the second line 120 and formed of the same material as the second line 120. The first line 110 can be one of the data line DLn, the initialization voltage line VL, and the driving voltage line PL, and the second line 120 can be one of the remaining lines. In an embodiment, the first line 110 is the data line DLn and the second line 120 is the initialization voltage line VL. In another embodiment, the first line 110 is the initialization voltage line VL and the second line 120 is the driving voltage line PL. In another embodiment, the first line 110 is the driving voltage line PL and the second line 120 is the data line DLn.

The first connection line 210 can be formed on a different layer from the first line 110 and can be connected to the first line 110 via a contact hole Cnt. In an embodiment, if the first line 110 is the data line DLn, the first connection line 210 is a fanout line that transfers a data signal from a data driver (not shown) of the driver IC to the first line 110. In another embodiment, if the first line 110 is the initialization voltage line VL, the first connection line 210 is an incoming line for supplying an initialization voltage from an initialization voltage supply line (not shown) to the first line 110. In another embodiment, if the first line 110 is the driving voltage line PL, the first connection line 210 is an incoming line for applying a driving voltage from a driving voltage supply line (not shown) to the first line 110.

The second connection line 220 can be formed on a different layer from the second line 120 and can be connected to the second line 120 via a contact hole Cnt. In an embodiment, if the second line 120 is the initialization voltage line VL, the second connection line 220 is an incoming line for supplying an initialization voltage from an initialization voltage supply line to the second line 120. In another embodiment, if the second line 120 is the driving voltage line PL, the second connection line 220 is an incoming line for supplying a driving voltage from a driving voltage supply line (not shown) to the second line 120. In another embodiment, if the second line 120 is the data line DLn, the second connection line 220 is a fanout line that transfers a data signal from the data driver (not shown) of the driver IC to the second line 120.

The first connection line 210 and the second connection line 220 are formed on different layers and extend in different directions. Thus, a plurality of cross areas A where the first and second lines 210 and 220 cross each other are formed in the non-display area NDA.

Figure 3:
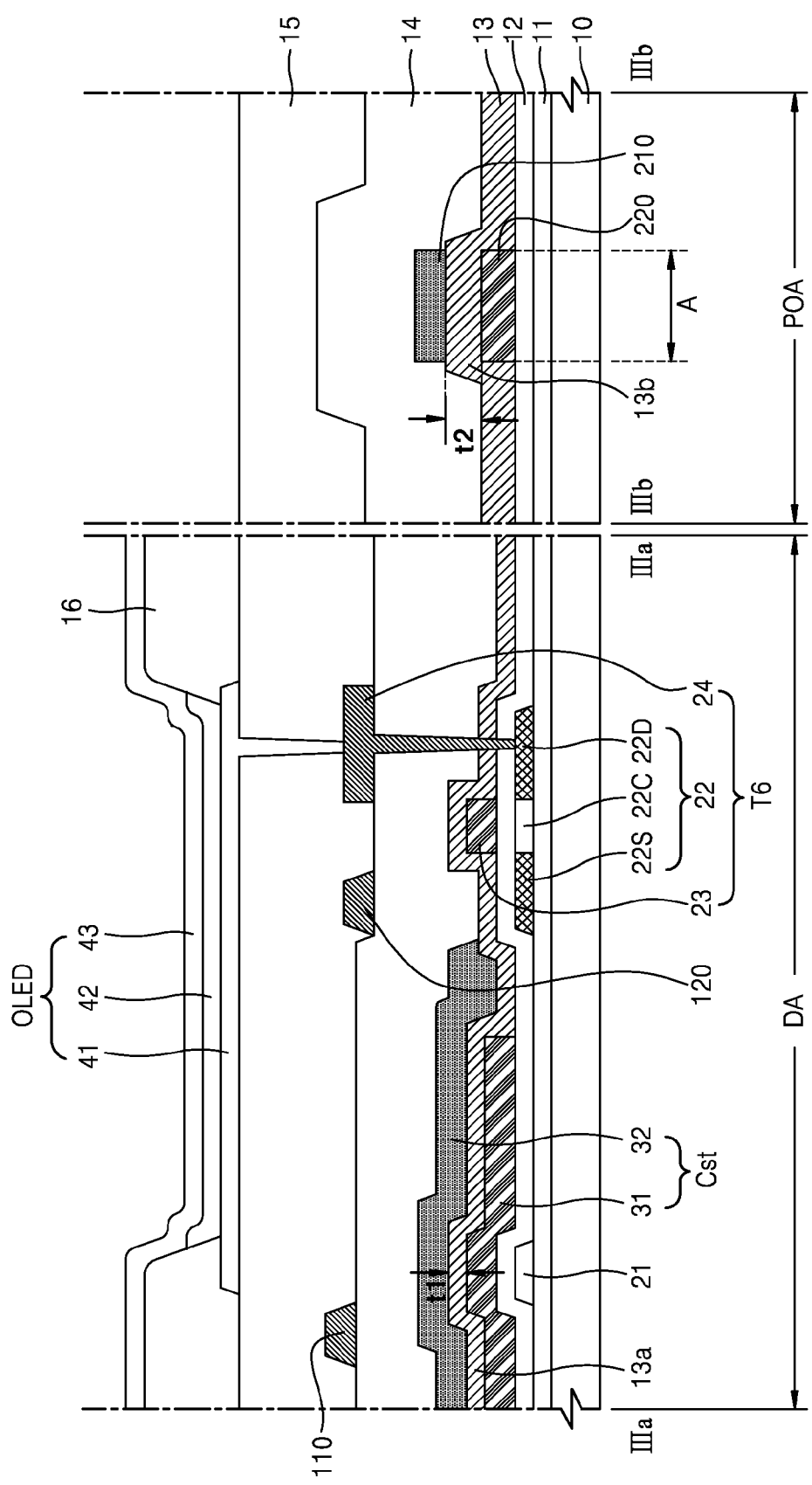
FIG. 3 is a cross-sectional view illustrating the display device, taken along lines IIIa-IIIa and IIIb-IIIb of FIG. 2.

FIG. 3 is a cross-sectional view illustrating the display device, taken along lines IIIa-IIIa and IIIb-IIIb of FIG. 2.

Referring to the cross-sectional view of FIG. 3 according to the line IIIa-IIIa, a buffer layer 11 is formed on the substrate 10, and active layers 21 and 22 are formed on the buffer layer 11. The buffer layer 11 forms a planar surface and prevents penetration of foreign substances. The buffer layer 11 can be a single layer or multiple layers formed of an inorganic material such as silicon nitride (SiNx) and/or silicon oxide (SiOx).

The active layers 21 and 22 can be formed of amorphous silicon or polysilicon or can be a G-I-Z-O layer [$(In_2O_3)a$ $(Ga_2O_3)b(ZnO)c$ layer] (where, a, b, c are real numbers that satisfy a≥0, b≥0, c>0, respectively).

Areas of the active layers 21 and 22 that are doped with impurity correspond to source and drain electrodes. The impurity can vary according to a type of a TFT and can be n-type impurity or p-type impurity. FIG. 3 illustrates a portion of the active layer 21 of the driving TFT T1 (refer to FIG. 1) that is not doped with impurity, a portion 22C of the active layer 22 of the second emission control TFT T6 (refer to FIG. 1) that is not doped with impurity, and a source electrode 22s and a drain electrode 22d of the second emission control TFT T6 that are doped with impurity.

A first insulating layer 12 that is a gate insulating layer can be formed on the active layers 21 and 22, and a first electrode 31 of the storage capacitor Cst and a gate electrode 23 can be formed on the first insulating layer 12.

The first insulating layer 12 can be formed of an inorganic material such as $SiO_2$, SiNx, SiON, $Al_2O_3$, $TiO_2$, $Ta_2O_5$, $HfO_2$, $ZrO_2$, BST, or PZT.

The first electrode 31 of the storage capacitor Cst and the gate electrode 23 can be formed as a single layer or multiple layers formed of at least one metal selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu). In an embodiment, the first electrode 31 of the storage capacitor Cst is formed on the active layer 21 and can substantially simultaneously function as a gate electrode of the driving TFT T1 (refer to FIG. 1).

A second insulating layer 13 is formed on the first electrode 31 of the storage capacitor Cst and the gate electrode 23. A second electrode 32 of the storage capacitor Cst is formed on the second insulating layer 13.

The second insulating layer 13 can be formed of an inorganic material such as $SiO_2$, SiNx, SiON, $Al_2O_3$, $TiO_2$, $Ta_2O_5$, $HfO_2$, $ZrO_2$, BST, or PZT.

The second electrode 32 of the storage capacitor Cst can be formed as a single layer or multiple layers formed of at least one metal selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu).

A third insulating layer 14 that is an interlayer insulating layer can be formed on the second electrode 32 of the storage capacitor Cst. The first and second lines 110 and 120 and a cover metal 24 can be formed on the third insulating layer 14.

The third insulating layer 14 can be formed as a single layer or multiple layers formed of an inorganic material such as $SiO_2$, SiNx, SiON, $Al_2O_3$, $TiO_2$, $Ta_2O_5$, $HfO_2$, $ZrO_2$, BST, or PZT.

Each of the first and second lines 110 and 120 and the cover metal 24 can be formed as a single layer or multiple layers formed of at least one metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

As described above, the first and second lines 110 and 120 can be formed to transfer a signal or a voltage and can be formed above the storage capacitor Cst by having the third insulating layer 14 interposed therebetween.

The cover metal 24 electrically connects one of the source electrode 22s and the drain electrode 22d to a pixel electrode 41. The cover metal 24 can be connected to one of the source electrode 22s and the drain electrode 22d through a via hole formed in the third insulating layer 14. The pixel electrode 41 can be connected to the cover metal 24 through a via hole formed in the fourth insulating layer 15.

The fourth insulating layer 15 can be a planarization layer that covers the first and second lines 110 and 120 and the cover metal 24. The fourth insulating layer 15 can be formed of an organic material. The pixel electrode 41 can be formed on the fourth insulating layer 15 and can be connected to the cover metal 24 through the via hole formed in the fourth insulating layer 15. A fifth insulating layer 16 that is a pixel-defining layer including an opening for exposing a top surface of the pixel electrode 41 can be formed on the pixel electrode 41.

An intermediate layer 42 including an emission layer is formed in the opening of the fifth insulating layer 16. The emission layer can be formed of a small molecule organic material and/or a polymer organic material that can emit red light, green light, blue light, or white light. In addition to the emission layer, the intermediate layer 42 can further include at least one selected from a hole injection layer (HIL), a hole transport layer (HTL), an electron transport layer (ETL), and an electron injection layer (EIL). In another embodiment, the intermediate layer 42 further includes various functional layers.

An opposite electrode 43 is formed on the intermediate layer 42. A hole from the pixel electrode 41 and an electrode from the opposite electrode 43 can be combined in the emission layer so that an exciton can be generated from the combination and can emit light when the exciton is changed from an exited state to a ground state.

In the present embodiment, the intermediate layer 42 including the emission layer formed of an organic material is interposed between the pixel electrode 41 and the opposite electrode 43, but embodiments are not limited thereto. In another embodiment, a liquid crystal layer is interposed between the pixel electrode 41 and the opposite electrode 43, and thus, the display device is a liquid crystal display.

Referring to FIG. 2 and the cross-sectional view of FIG. 3 according to the line IIIb-IIIb, the first and second connection lines 210 and 220 that extend in different directions are formed above the substrate 10 on which the buffer layer 11 and the first insulating layer 12 are formed.

The first and second connection lines 210 and 220 are formed on different layers. The first connection line 210 is formed on the same layer as the second electrode 32 of the storage capacitor Cst and formed of the same material as the second electrode 32 of the storage capacitor Cst. The second connection line 220 is formed on the same layer as the first electrode 31 and formed of the same material as the first electrode 31.

As described with reference to FIG. 2, the first connection line 210 and the second connection line 220 are connected to the first line 110 and the second line 120, respectively, via the contact holes Cnt, and at least partially overlap each other in the cross area A.

In the cross area A, a portion of the first connection line 210 and a portion of the second connection line 220 overlap with each other. A second portion 13b of the second insulating layer 13 is interposed therebetween. The second insulating layer 13 can be formed on the entire surface of the substrate 10 so as to make a first portion 13a interposed between the first and second electrodes 31 and 32 of the storage capacitor Cst.

The second insulating layer 13 can determine capacitance of the storage capacitor Cst. When the second insulating layer 13 is too thick, the display device does not have sufficient capacitance to properly function. When the second insulating layer 13 is formed so as to have sufficient capacitance, a vertical short circuit can occur between the first connection line 210 and the second connection line 220.

However, according to the one or more exemplary embodiments, the thickness of the second insulating layer 13 varies in its portions, so that sufficient capacitance can be assured and a vertical short circuit between the first connection line 210 and the second connection line 220 can be prevented. For example, when the second insulating layer 13 is formed, a thickness t1 of the first portion 13a is formed to be less than a thickness t2 of the second portion 13b by using a halftone mask. In an embodiment, the thickness t1 of the first portion 13a is formed to be substantially equal to or less than about 1200 Å so that the sufficient capacitance is assured, and the thickness t2 of the second portion 13b is formed to be substantially equal to or greater than about 2000 Å so that the vertical short circuit is be prevented.

Figure 4:
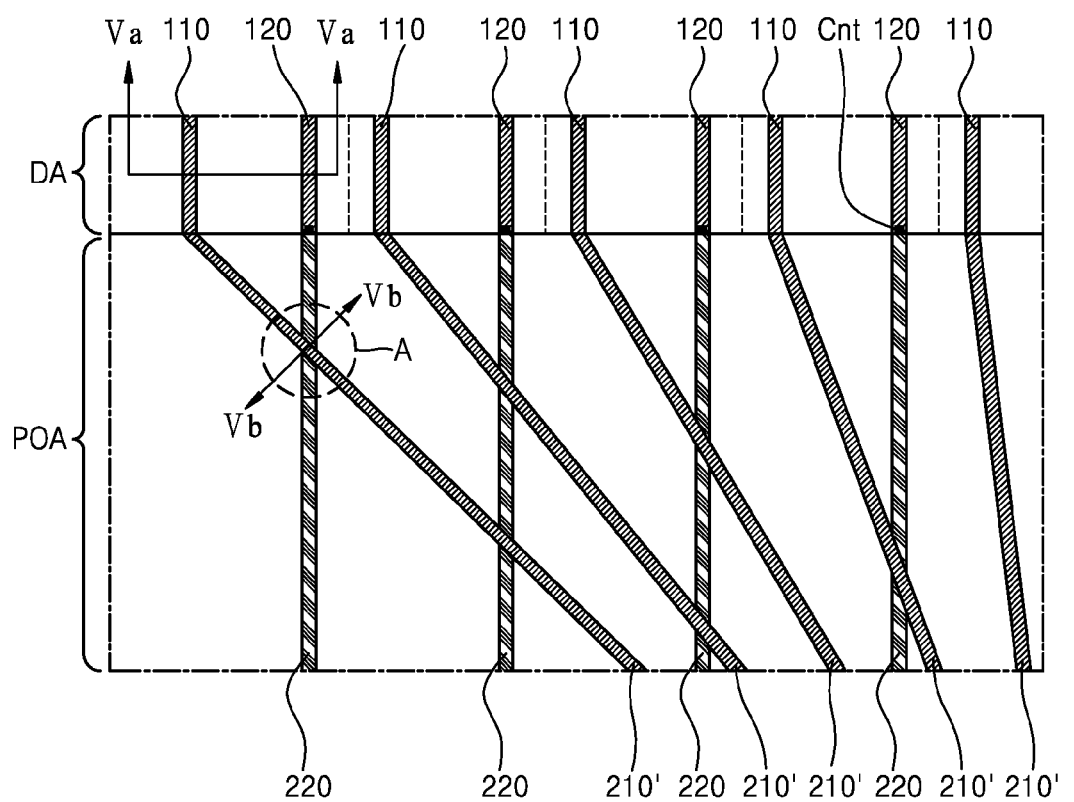
FIG. 4 is a magnified plan view of the portion S shown in FIG. 1, according to another exemplary embodiment.
Figure 4:
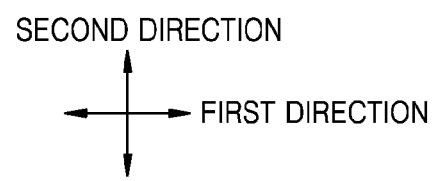

FIG. 4 is a magnified plan view of the portion S shown in FIG. 1, according to another exemplary embodiment.

Referring to FIG. 4, the first line 110 and the second line 120 that extend lengthwise along a second direction are formed in the display area DA. The first connection line 210 that is connected to the first line 110 and the second connection line 220 that is connected to the second line 120 are formed in the connection area POA.

The first line 110 can be formed on the same layer as the second line 120 and formed of the same material as the second line 120. As described above, the first line 110 can be one of the data line DLn, the initialization voltage line VL, and the driving voltage line PL, and the second line 120 can be one of the remaining lines.

In the present embodiment, a first connection line 210' is formed on the same layer as the first line 110, and the second connection line 220 is formed on a different layer from the second line 120 and is connected to the second line 120 via a contact hole Cnt.

The first connection line 210' and the second connection line 220 are formed on different layers and extend in different directions. Thus, a plurality of cross areas A where the first connection line 210' and the second connection line 220 cross each other are formed in the non-display area NDA.

Figure 5:
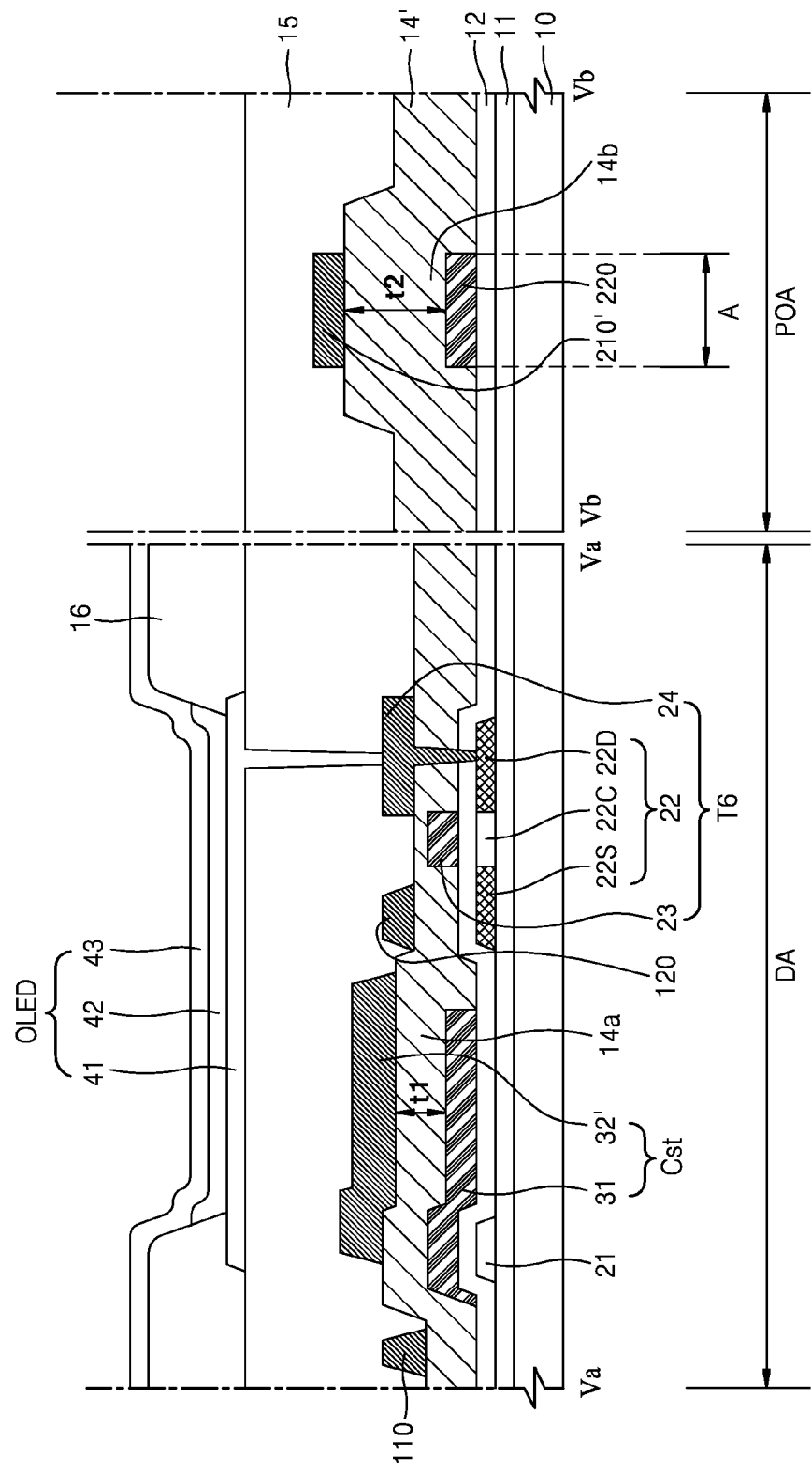
FIG. 5 is a cross-sectional view illustrating the display device, taken along lines Va-Va and Vb-Vb of FIG. 4.

FIG. 5 is a cross-sectional view illustrating the display device, taken along lines Va-Va and Vb-Vb of FIG. 4.

Referring to the cross-sectional view of FIG. 5 according to the line Va-Va, as described above with reference to FIG. 3, the first electrode 31 of the storage capacitor Cst can be formed of the same material as the gate electrode 23, and a second electrode 32' of the storage capacitor Cst can be formed on the same layer as the first and second lines 110 and 120. By forming the first and second lines 110 and 120 and the second electrode 32' formed on the same layer, the number of mask processes in a manufacturing procedure of the display device can be reduced.

A third insulating layer 14' is interposed between the first electrode 31 and the second electrode 32' of the storage capacitor Cst and can determine capacitance of the storage capacitor Cst.

Referring to the cross-sectional view of FIG. 5 according to the line Vb-Vb, the first connection line 210' and the second connection line 220 are formed on different layers. The first connection line 210' is formed on the same layer as the second electrode 32' and formed of the same material as the second electrode 32'. And the second connection line 220 is formed on the same layer as the first electrode 31 and formed of the same material as the first electrode 31.

As described above with reference to FIG. 4, the first connection line 210' and the second connection line 220 are respectively connected to the first line 110 and the second line 120 and at least partially overlap with each other in the cross area A.

In the cross area A, a portion of the first connection line 210' and a portion of the second connection line 220 overlap each other, and the third insulating layer 14' is interposed therebetween. The third insulating layer 14' can be formed on the entire surface of the substrate 10 so as to form a first portion 14a interposed between the first and second electrodes 31 and 32'.

The third insulating layer 14' can determine the capacitance of the storage capacitor Cst. If the third insulating layer 14' has a large thickness, the display device does not have sufficient capacitance. If the third insulating layer 14' is thinly formed so as to have sufficient capacitance, the thickness of the third insulating layer 14' that electrically insulates the first connection line 210' from the second connection line 220 is small such that a vertical short circuit can occur between the first connection line 210' and the second connection line 220.

However, according to the one or more exemplary embodiments, the thickness of the third insulating layer 14' varies in its portions, so that sufficient capacitance can be assured and a vertical short circuit between the first connection line 210' and the second connection line 220 can be prevented. For example, when the third insulating layer 14' is formed, a thickness t1 of the first portion 14a can be formed to be less than a thickness t2 of a second portion 14b by using a halftone mask. In an embodiment, the thickness t1 of the first portion 14a is formed to be substantially equal to or less than about 1200 Å so that the sufficient capacitance can be assured. And in the embodiment, the thickness t2 of the second portion 14b is formed to be substantially equal to or greater than about 2000 Å so that the vertical short circuit is prevented.

As described above, according to the one or more of the above exemplary embodiments, a short circuit between lines is prevented in the display device.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:
1. A display device comprising:
 a substrate including i) a display area configured to display an image via a plurality of pixels and ii) a non-display area adjacent to the display area;
 a first line and a second line formed in the display area, and wherein each of the first and second lines is configured to transfer an electrical signal to the pixels;
 a first connection line and a second connection line formed in the non-display area, wherein the first and second connection lines are respectively connected to the first and second lines and extend in different directions to cross each other; and an insulating layer formed over the substrate and including a first portion and a second portion, wherein the first portion corresponds to the display area and the second portion corresponds to a crossing area where the first and second connection lines cross each other, and wherein the thickness of the first portion is different from the thickness of the second portion.

2. The display device of claim 1, wherein the first and second connection lines are formed on different layers, and wherein the second portion of the insulating layer is interposed between the first and second connection lines.

3. The display device of claim 1, further comprising a storage capacitor formed in the display area and including a first electrode and a second electrode formed over the first electrode, wherein the first portion of the insulating layer is interposed between the first and second electrodes.

4. The display device of claims 1, wherein the second portion is thicker than the first portion.

5. The display device of claim 3, wherein the first connection line is formed on the same layer and of the same material as the first electrode, and wherein the second connection line is formed on the same layer and of the same material as the second electrode.

6. The display device of claim 1, wherein each of the pixels is electrically connected to a data line configured to transfer a data signal, a driving voltage line configured to transfer a driving voltage, and an initialization voltage line configured to transfer an initialization voltage,
wherein the first line is one of the data line, the driving voltage line, and the initialization voltage line, and
wherein the second line is another one of the data line, the driving voltage line, and the initialization voltage line.

7. The display device of claim 1, wherein the first line and the first connection line are formed on different layers and are electrically connected to each other via a first contact hole.

8. The display device of claim 1, wherein the first line and the first connection line are formed on the same layer.

9. The display device of claim 7, wherein the second line and the second connection line are formed on different layers and are electrically connected to each other via a second contact hole.

10. The display device of claim 1, wherein the thickness of the second portion of the insulating layer is substantially equal to or greater than about 2000 Å.

11. The display device of claim 1, wherein the thickness of the first portion of the insulating layer is substantially equal to or less than about 1200 Å.

12. A display device comprising:
a substrate including i) a display area configured to display an image via a plurality of pixels and ii) a crossing area formed adjacent to the display area;
a first line and a second line formed in the display area and the crossing area, wherein the first and second lines at least partially overlap each other in the crossing area; and
an insulating layer formed over the substrate and including a first portion and a second portion, wherein the first portion corresponds to the display area and the second portion corresponds to the crossing area, and wherein the thickness of the first portion is different from the thickness of the second portion.

13. The display device of claim 12, wherein the first and second lines are formed on different layers in the crossing area, and wherein the second portion of the insulating layer is interposed between the first and second lines.

14. The display device of claim 12, further comprising a storage capacitor formed in the display area and including a first electrode and a second electrode formed over the first electrode, wherein the first portion of the insulating layer is interposed between the first and second electrodes.

15. The display device of claims 12, wherein the second portion is thicker than the first portion.

16. The display device of claim 14, wherein the first line is formed on the same layer and of the same material as the first electrode in the crossing area, and wherein the second line is formed on the same layer and of the same material as the second electrode in the crossing area.

17. The display device of claim 12, wherein each of the pixels is electrically connected to a data line configured to transfer a data signal, a driving voltage line configured to transfer a driving voltage, and an initialization voltage line configured to transfer an initialization voltage,
wherein the first line is one of the data line, the driving voltage line, and the initialization voltage line, and
wherein the second line is another one of the data line, the driving voltage line, and the initialization voltage line.

18. The display device of claim 12, wherein a first portion of the first line in the display area and a second portion of the first line in the crossing area are formed on different layers and are electrically connected to each other via a first contact hole, and wherein a first portion of the second line in the display area and a second portion of the second line in the crossing area are formed on different layers and are electrically connected to each other via a second contact hole.

19. The display device of claim 12, wherein the thickness of the second portion of the insulating layer is substantially equal to or greater than about 2000 Å.

20. The display device of claim 12, wherein the thickness of the first portion of the insulating layer is substantially equal to or less than about 1200 Å.

* * * * *